United States Patent [19]
Bussen

[11] 3,984,798
[45] Oct. 5, 1976

[54] HOTSTICK APPLICATOR FOR FAULT INDICATOR CORES

[75] Inventor: Michael Robert Bussen, Arnold, Mo.

[73] Assignee: International Telephone and Telegraph Corporation, New York, N.Y.

[22] Filed: Nov. 21, 1974

[21] Appl. No.: 525,942

[52] U.S. Cl. ............................. 336/176; 29/203 H; 324/127
[51] Int. Cl.² ........................................ H01F 17/06
[58] Field of Search ...... 29/203 R, 203 H, 203 HM; 244/106, 85, 99 R; 324/127, 129; 336/176; 81/72, 53.1; 24/248 SA, 248 SB, 132 SB; 339/14 L, 108 R, 109, 243, 263 L, 265 L, 266 G, 266 L

[56] References Cited
UNITED STATES PATENTS

| | | | |
|---|---|---|---|
| 2,183,680 | 12/1939 | Kahliff | 294/106 X |
| 2,954,063 | 9/1960 | Wilbur | 294/106 X |
| 2,966,817 | 1/1961 | Wengen | 81/53.1 |
| 3,253,215 | 5/1966 | Moakler et al. | 324/127 X |
| 3,453,544 | 7/1969 | Schweitzer, Jr. | 324/127 |
| 3,649,062 | 3/1972 | Young, Jr. | 294/106 |

FOREIGN PATENTS OR APPLICATIONS

| | | | |
|---|---|---|---|
| 385,946 | 3/1965 | Switzerland | 339/109 |
| 327,837 | 4/1930 | United Kingdom | 324/127 |

Primary Examiner—Thomas J. Kozma
Attorney, Agent, or Firm—James B. Raden; William J. Michals

[57] ABSTRACT

The disclosed device is adapted for placing a ferrite core onto an energized power distribution system cable and includes a pair of generally U-shaped core holders. Each holder receives a core half which is loosely retained within the concave portion of the holder by an elastomeric "O" ring. The holders are pivotally mounted at one of their end portions to opposite ends of a saddle member wherein the free ends of the holders, and therefore the core halves, are translatable into either abutting or open relationship. The length of the saddle member is selected so as to provide a stop which limits the maximum opening of the core holders. An eye bolt threadedly engages the saddle member along a threaded transverse bore therein wherein the threaded end of the bolt engages overlapping portions of the pivot ends of the core holders. An elastomeric sleeve surrounds the saddle member and the overlapping pivot ends of the core holders and urges the holders toward their abutting position. Flanges extend from the sleeve toward the free ends of the core holders to orient a pick-up coil within the device. The eye of the eye bolt projects from the sleeve for engagement with the hook end of a hotstick. The eye bolt is provided with a left-hand thread so that clockwise rotation of the bolt closes the core holders, and therefore the core halves, around the cable.

9 Claims, 10 Drawing Figures

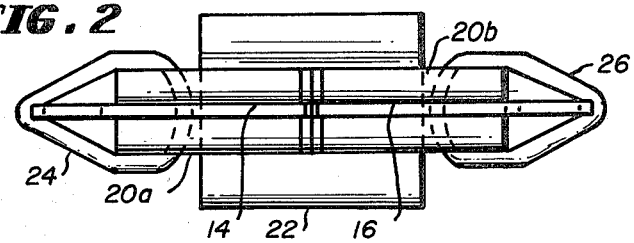
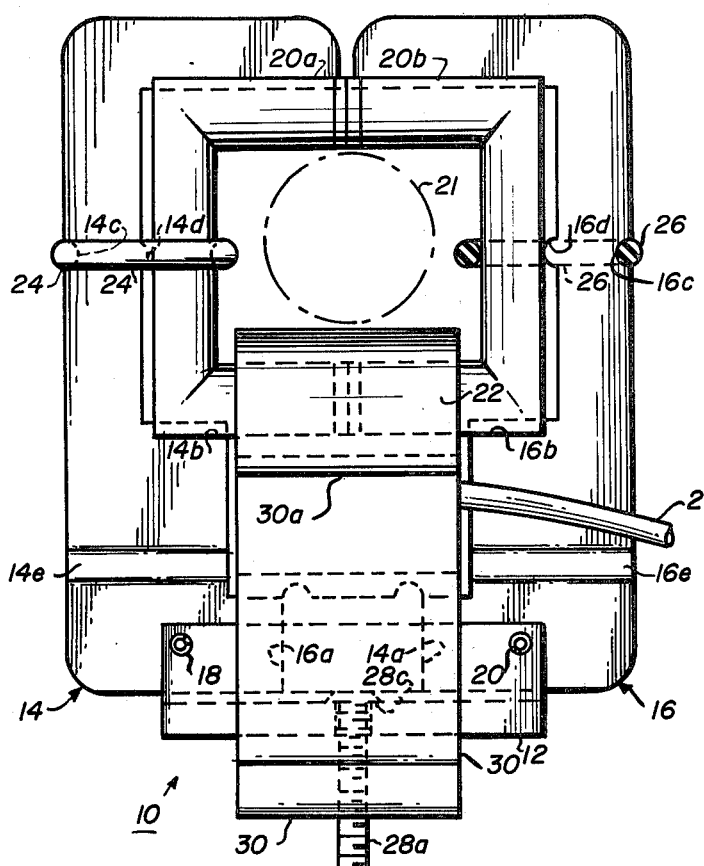
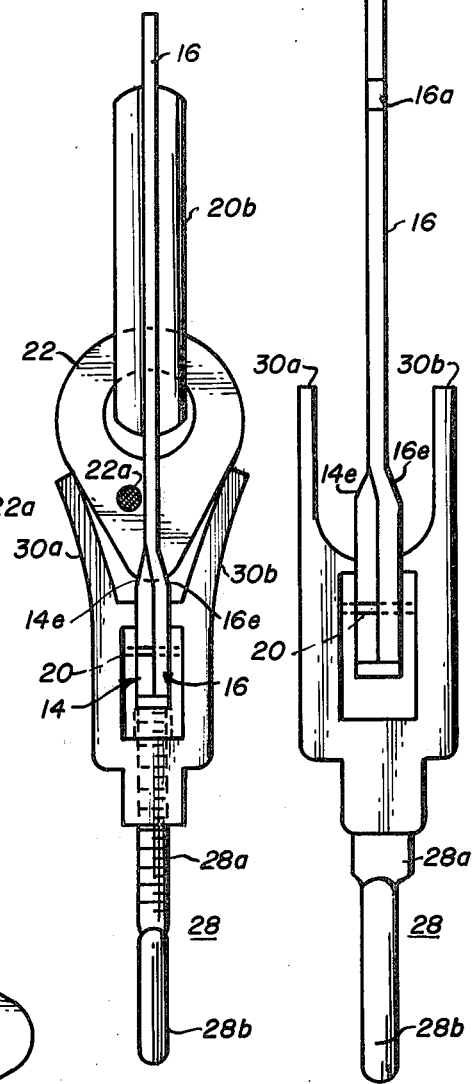
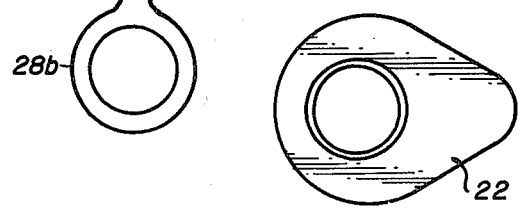
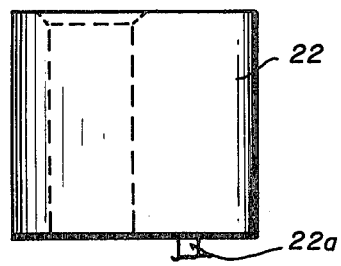

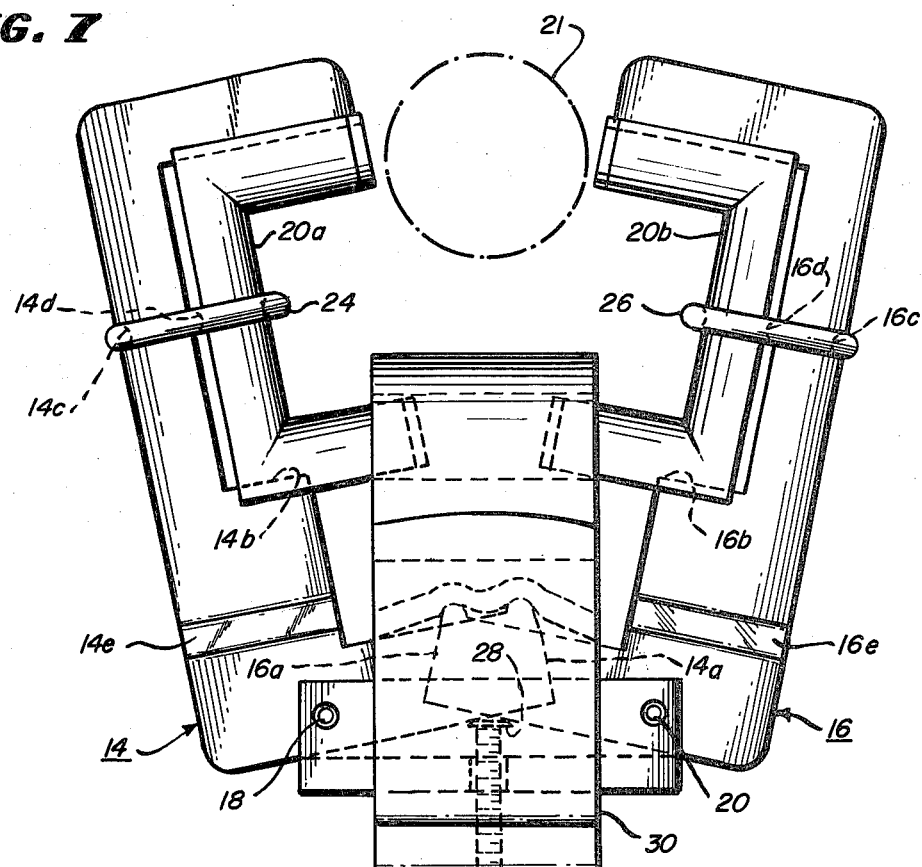
FIG. 7
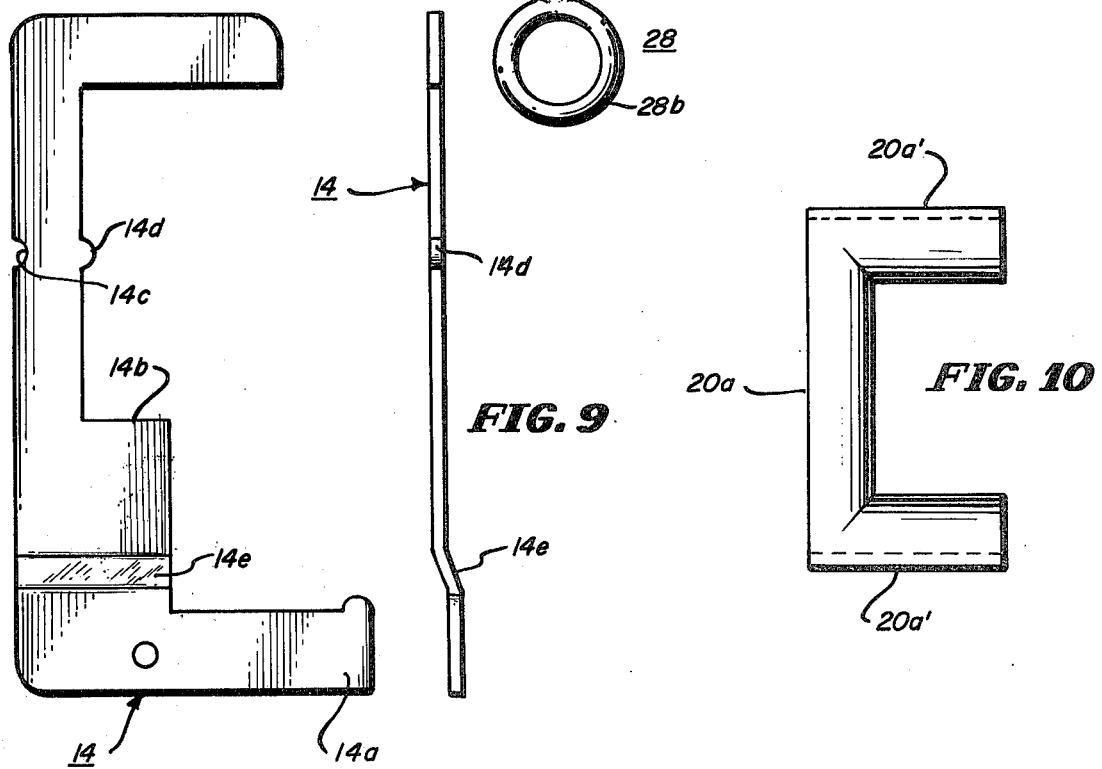
FIG. 8
FIG. 9
FIG. 10

3,984,798

HOTSTICK APPLICATOR FOR FAULT INDICATOR CORES

BACKGROUND OF THE INVENTION

The present invention relates to an adaptor for placing a sensor onto an energized cable of a power distribution system by means of a hotstick. More particularly, the present invention relates to such an adaptor for placing a fault indicator ferrite core onto the energized cable.

In power distribution systems there exists a need for placing various types of instrumentation and monitoring devices, such as a fault indicator core, onto a cable of the distribution system. These devices are normally installed adjacent to equipment such as transformers in an underground vault. In the prior art, the procedure for installing such devices has been to disconnect the power source from the installations by means of one or more of the switching devices and, thereafter, manually placing the device onto the power cable. However, this procedure not only necessitates shutting down the power distribution system but also requires that the operator or lineman must place himself into a potentially dangerous or generally inaccessible installation such as, for example, the environment of an underground vault.

These and other disadvantages are overcome by the present invention wherein there is provided an adaptor which permits installation of such devices onto an energized cable by means of a lanyard or hotstick.

SUMMARY OF THE INVENTION

Briefly, there is provided an applicator for applying a separable device, such as a ferrite core, onto a power distribution system cable by means of a hotstick. The applicator comprises a saddle member and first and second device holders. Each holder receives a portion of the device and the holders are respectively pivotally mounted at one end thereof to the saddle member at opposite ends thereof wherein the free ends of the holders are translatable toward and away from each other. Each holder has a projection in the direction of the opposite pivotal mounting and spring maintenance are provided for urging the holders towards each other. Rotatable means extends through the saddle member and includes a first end engaging the projections of the holders and a second end engagable with the hotstick for translating the holders in response to a rotation of the rotatable means.

BRIEF DESCRIPTION OF THE DRAWING

The advantages of this invention will become more readily appreciated as the same becomes better understood by reference to the following detailed description when taken in conjunction with the accompanying drawing wherein:

FIG. 1 is a plan view of an applicator in accordance with the present invention and illustrated in conjunction with a ferrite core and its associated pick-up coil;

FIG. 2 is a top view of FIG. 1;

FIGS. 3 and 4 are side views of the applicator of FIG. 1;

FIGS. 5 and 6 are respectively end and plan views of the pick-up coil illustrated in FIGS. 1–3;

FIG. 7 is a plan view of the applicator of FIG. 1 and is illustrated in the open position of the applicator;

FIGS. 8 and 9 are plan and side views respectively of one of the device holders of the applicator in accordance with the present invention; and, FIG. 10 is a plan view of a core half for which the holder of FIGS. 8 and 9 is adapted to receive.

DETAILED DESCRIPTION

Referring now to FIG. 1, there is shown generally at 10 an adaptor in accordance with the present invention. Adaptor 10 includes a saddle member 12 which is preferably a channel member adapted to receive device holders 14 and 16. Holders 14 and 16 are pivotally mounted to member 12 respectively at pivot points 18 and 20. The pivot points are preferably provided by means of spring pins which are force fit into member 12.

Holders 14 and 16 include projections 14a and 16a, respectively, which project toward the opposite pivot point and may overlap one another, if desired, as illustrated in FIG. 1. Holders 14 and 16 generally take the form of U-shaped members wherein the free ends thereof are translatable into either abutting or open relationship by virtue of the pivotal mountings at 18 and 20. Holders 14 and 16 include step portions at 14b and 16b, respectively, thereby to provide a generally rectangular opening within applicator 10 when holders 14 and 16 are in their closed or abutting positions.

Applicator 10 as illustrated in the present drawing is adapted to receive a separable magnetic core, which may comprise a ferrite core, comprising core halves 20a and 20b which cooperate with a pick-up coil 22 having a lead 22a extending therefrom. The completed assembly of applicator 10 encircles a cable 21 of a power distribution system. Core halves 20a and 20b are retained within holders 14 and 16 of applicator 10 by means of elastomeric O rings 24 and 26 respectively; and O rings 24 and 26 are retained in a relatively fixed position by means of curved openings or notches 14c and 16c of the holders. It can be seen that holders 14 and 16 provide support and protection for the ferrite core while allowing the core halves to move for purposes of self-alignment. The self-alignment feature is provided by pivot points 14d and 16d respectively projecting from holders 14 and 16. Pivot points 14d and 16d may also take the form of a curved surface projection of a given radii wherein the straight edges of the core halves tangentially engage a corresponding point along the curved surface projections.

The force for translating applicator 10 into its open position (as illustrated in FIG. 7) is preferably applied by means of eye bolt 28 having a threaded portion 28a which threadedly engages saddle member 12, and an eye portion 28b which removably engages or mates with the hook of a hotstick such as a shotgun hotstick. The end portion 28c of eye bolt 28 engages the extended projections 14a and 16a of holders 14 and 16. It can be seen that as eye bolt 28 is advanced into member 12 of applicator 10, holders 14 and 16 are translated away from each other and away from cable 21. The first or end thread of eye bolt 28 is preferably staked or suitably deformed to prevent removal of eye bolt 28 from applicator 10.

Spring means in the form of an elastomeric spring sleeve 30 surrounds saddle member 12 and therefore, projections 14a and 16a therein. The component of force supplied by sleeve 30 urges holders 14 and 16 into their closed or abutting position. Thus, as eye bolt 28 is backed out of member 12 and out of engagement with projections 14a and 16a, holders 14 and 16 are urged into their closed position at which time the self-aligning cores 20a and 20b form a closed, generally rectangular and unitary core about cable 21 as illustrated in FIG. 1. It should be noted that sleeve 30 may also include a threaded metallic sleeve or insert disposed in a suitable bore thereby to provide the threaded engagement of eye bolt 28 with applicator 10. This alternate embodiment simplifies the structural requirements and reduces the manufacturing cost of saddle member 12. Finally, it can be seen by reference to FIGS. 1 and 7 that the length of saddle member 12 can be selected to provide a stop which limits the maximum opening of holders 14 and 16.

FIGS. 2, 3 and 4 further illustrate the general construction of applicator 10 in accordance with the present invention. As best illustrated in FIGS. 3 and 4, holders 14 and 16 are respectively provided with transition sections 14e and 16e. These offset portions allow projections 14a and 16a to overlap in channel member 12 while permitting the core holder portions of holders 14 and 16 to reside in a common plane. However, it will be appreciated that holders 14 and 16 can be provided without transition sections and without overlapping projections — in which case eye bolt 28 would engage the abutting portions of the projections. It can also be seen by reference to FIGS. 2–4 that sleeve 30 is provided with flanges 30a and 30b which yieldably engage pick-up coil 22 to retain and orient pick-up coil 22 within applicator 10.

Referring now to FIGS. 5 and 6, there are shown end and plan views of pick-up coil 22. It can be seen that pick-up coil 22 has a generally egg-shaped cross section by virtue of having an enclosed chamber at the apex of the egg-shaped cross section to accommodate the connection of lead 22a therein. Otherwise, pick-up coil 22 comprises a well-known bobbin construction wherein a coil is wound about the bobbin and wherein pick-up coil 22 has a bore extending therethrough to accept portions of core halves 20a and 20b. Further, it can be seen by reference to FIG. 10 that the core halves are provided with slots 20a' which slidably engage the corresponding perimeter of the opening provided by holders 14 and 16. It will be appreciated by those skilled in the art that core halves 20a and 20b can be, and in the preferred embodiment are, conventional television-type "fly-back" transformer cores. For a general description of such ferrite cores and pick-up coils, and a more detailed discussion of the application of a fault indicator using these elements, reference may be had to the co-pending application of R. Boyd and A. Lindberg, Ser. No. 399,080, now U.S. Pat. No. 3,895,296, filed Sept. 19, 1973 and assigned to the same assignee as the present invention.

FIGS. 8 and 9 are plan and side views respectively of device holder 14 of applicator 10 in accordance with the present invention. It can be seen that holder 14 is constructed from generally flat metal stock and is suitably formed or stamped to provide the desired configuration. It should now be appreciated that the physical configuration of holder 14 is identical to that of holder 16 but due to their reversed assembled positions, and the transition portions such as 14e, an overlapping relationship at projections 14a and 16a is nevertheless provided.

As previously alluded to, FIG. 7 illustrates applicator 10 in its open position such as when applicator 10 is being placed about cable 21. In one constructed embodiment eye bolt 28 was provided with left-hand threads so that counterclockwise rotation of bolt 28 would open holders 14 and 16 whereas clockwise rotation of bolt 28 would close the core holders, and therefore the core halves, around cable 21. In currently preferred practice, however, bolt 28 is provided with a right-hand thread for cost reduction purposes. Further, member 12 is currently provided in the form of a two part metal stamping joined together by the pivotal mounting means rather than an integral U-shaped casting, again for cost reduction purposes; and in this case bolt 28 threadedly engages a threaded metallic insert or sleeve which is embedded in a bore in sleeve 30. It will be appreciated that cost reduction is a significant consideration in that applicator 10 is normally left at the installation cite, i.e., about the cable. That is, after attachment to the cable, applicator 10 remains at the installation to maintain the assembly and to provide protection for core halves 20a and 20b. However, it should be appreciated that in the event of damage to one or both of the core halves, during either installation or operation, either one or both halves readily can be replaced by simply opening the applicator, removing the associated O ring, and replacing the damaged core with a new core.

What has been taught, then, is an applicator for applying separable devices to an energized cable of a power distribution system by means of a hotstick. It will be appreciated that the operation can be conducted entirely from a position remote from the cable iself. The form of the invention illustrated and described herein is but a preferred embodiment of these teachings. It is shown as an illustration of the inventive concept, however, rather than by way of limitation, and it is pointed out that various modifications and alterations may be indulged in within the scope of the appended claims.

What is claimed is:

1. An applicator including a separable device and having means for applying said device to a power distribution system cable with a hotstick, said applicator comprising:

a saddle member;

first and second device holders, each holder receiving a portion of said device and said holders being respectively pivotally mounted at one end thereof to said saddle member at opposite ends thereof wherein the free ends of said holders are translatable toward and away from each other and each holder having a projection in the direction of the opposite pivotal mounting;

spring means for urging said holders toward each other;

rotatable means extending through said saddle member and having a first end engaging said projections of said holders and having a second end engagable with said hotstick for translating said holders in response to rotation of said rotatable means;

wherein: said holders each comprise a generally U-shaped member having a generally flat cross section, and said saddle member comprises a generally U-shaped channel member receptive of said holders and providing a pivot point means at each end thereof for pivotally mounting said holders;

wherein said device is a magnetic core having first and second separable sections respectively received by said first and second holders; and, wherein said spring means includes an elastomeric sleeve surrounding said channel member and said projections received therein, thereby to urge said holders and said core sections towards each other.

2. The applicator according to claim 1, wherein said rotatable means comprises a bolt, and means for threadedly engaging said bolt with said elastomeric sleeve.

3. The applicator according to claim 1, wherein said sleeve includes at least one flange portion projecting toward said core sections for retainingly orientating a pick-up coil disposed about a portion of said core.

4. The applicator according to claim 3, wherein said holders each include a stepped portion thereby to form a generally rectangular opening in said applicator when said holders are moved toward each other; and, wherein said core sections are provided with slot portions wherein said core sections are slidably received in said rectangular opening.

5. The applicator according to claim 4, wherein each of said holders include a pivot point surface projection along a portion of said rectangular opening to provide a pivotal mounting for said slotted core sections thereby to accommodate self-aligning movement of said core sections.

6. The applicator according to claim 5, wherein each of said holders include a notch portion along the outer perimeter thereof and wherein said core sections are respectively retained within said holders by an O ring received in each of said notches.

7. The applicator according to claim 6, wherein said projections of said holders are offset in opposite directions with respect to the plane of said holders and extend in overlapping relationship.

8. The applicator according to claim 7, wherein the length of said channel member is selected to provide a stop to limit the maximum translation of said holders away from each other.

9. The applicator according to claim 8, wherein said pivot point means comprise tubular spring pins which are force fit into corresponding bores in said channel member.

* * * * *